United States Patent
Kim et al.

(10) Patent No.: US 7,456,573 B2
(45) Date of Patent: Nov. 25, 2008

(54) PLASMA DISPLAY APPARATUS INCLUDING AT LEAST ONE OF A THERMALLY CONDUCTIVE LAYER AND A NOISE REDUCTION LAYER

(75) Inventors: Ki-Jung Kim, Suwon-si (KR); Seok-Gyun Woo, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 462 days.

(21) Appl. No.: 11/189,175

(22) Filed: Jul. 25, 2005

(65) Prior Publication Data
US 2006/0028137 A1    Feb. 9, 2006

(30) Foreign Application Priority Data
Aug. 5, 2004    (KR) .............. 10-2004-0061675

(51) Int. Cl.
*H01J 17/49* (2006.01)
(52) U.S. Cl. .................... 313/582; 313/584
(58) Field of Classification Search ......... 313/582–587, 313/46, 44
See application file for complete search history.

(56) References Cited

U.S. PATENT DOCUMENTS

| | | | | |
|---|---|---|---|---|
| 5,971,566 | A * | 10/1999 | Tani et al. | 362/294 |
| 6,617,767 | B2 * | 9/2003 | Juen | 313/44 |
| 6,873,105 | B2 * | 3/2005 | Akiba | 313/586 |
| 7,262,552 | B2 * | 8/2007 | Nomoto et al. | 313/582 |
| 2004/0119410 | A1 * | 6/2004 | Jun et al. | 313/582 |
| 2005/0066238 | A1 * | 3/2005 | Park | 714/43 |
| 2005/0068738 | A1 * | 3/2005 | Kim et al. | 361/704 |
| 2005/0179381 | A1 * | 8/2005 | Kim et al. | 313/582 |
| 2005/0264982 | A1 * | 12/2005 | Kim et al. | 361/679 |

FOREIGN PATENT DOCUMENTS

| | | |
|---|---|---|
| JP | 10-040823 | 2/1998 |
| JP | 2000-352934 | 12/2000 |
| JP | 2002-123179 | 4/2002 |

(Continued)

OTHER PUBLICATIONS

Notice to Submit Response by Korean Intellectual Property Office on Oct. 17, 2006.
Notice to Submit Response by Korean Intellectual Property Office issued on Apr. 24, 2006.

*Primary Examiner*—Joseph L Williams
(74) *Attorney, Agent, or Firm*—Knobbe Martens Olson & Bear LLP

(57) ABSTRACT

A plasma display apparatus is disclosed. In one embodiment, the apparatus transfers heat generated from a plasma display panel through a thermally conductive layer, and thus, prevents the heat from being locally concentrated on the plasma display panel, and has an improved heat dissipation performance. Furthermore, the plasma display apparatus reduces vibration generated in a circuit portion attached to a chassis or a plasma display panel, thereby reducing noise. The plasma display apparatus includes a plasma display panel, a chassis supporting the plasma display panel, and a sheet interposed between the plasma display panel and the chassis and comprising a thermally conductive layer contacting the plasma display panel and a noise reduction layer contacting the chassis.

20 Claims, 5 Drawing Sheets

FOREIGN PATENT DOCUMENTS

| | | |
|---|---|---|
| JP | 2003-228295 | 8/2003 |
| JP | 2004-038173 | 2/2004 |
| JP | 2004-206076 | 7/2004 |
| KR | 2003-0005527 | 1/2003 |
| KR | 10-2004-0008265 | 1/2004 |
| KR | 2005041070 A * | 5/2005 |

* cited by examiner

PLASMA DISPLAY APPARATUS INCLUDING AT LEAST ONE OF A THERMALLY CONDUCTIVE LAYER AND A NOISE REDUCTION LAYER

BACKGROUND OF THE INVENTION

This application claims the benefit of Korean Patent Application No. 10-2004-0061675, filed on Aug. 5, 2004, in the Korean Intellectual Property Office, the disclosure of which is incorporated herein in its entirety by reference.

1. Field of the Invention

The present invention relates to a plasma display apparatus, and more particularly, to a plasma display apparatus having an improved heat dissipating performance and a reduced noise level.

2. Description of the Related Technology

Plasma display panels, which form an image using a gas discharge, have excellent display properties such as high display capacity, brightness, and contrast, reduced after-image, and a large viewing angle, and accordingly, are spotlighted as leading flat panel display devices.

In plasma display panels, a direct voltage or an alternating voltage is applied to electrodes and causes discharge to occur in discharge cells filled with a discharge gas. Ultraviolet rays are emitted from the discharge gas to cause excitation of phosphors. The excited phosphors radiate visible light rays to realize images.

Plasma display panels use a discharge mechanism in which a high voltage is applied to discharge cells and a discharge occurs, thus generating light. During driving (operation) of the plasma display panels, a significant amount of heat is generated between the discharge cells which selectively generate the discharge. Furthermore, when heat is not properly transferred, the heat is locally concentrated, and thus image quality deteriorates and phosphors are damaged, thus shortening the lifetime of plasma display panels.

In realizing images, shock waves are generated due to a discharge in the discharge cells. The shock waves impact inner surfaces of the discharge cells and thus, noise is generated. If the generation of noise is left unchecked, plasma display panels used for household display devices have diminished commercial reliability.

SUMMARY OF CERTAIN INVENTIVE ASPECTS

One aspect of the present invention provides a plasma display apparatus having the following advantages.

First, heat generated from a plasma display panel is transferred through a thermally conductive layer, preventing the heat from being locally concentrated on the plasma display panel, thereby allowing for a high quality plasma display apparatus.

Second, heat generated from a plasma display panel is transferred to a thermally conductive layer and then, efficiently dissipated through a heat dissipation unit, thereby increasing heat dissipating performance of a plasma display apparatus.

Third, vibration generated in a circuit portion attached to a chassis or a plasma display panel is reduced, thereby reducing noise of a plasma display apparatus.

Fourth, heat generated from a plasma display panel is prevented from deteriorating properties of a circuit portion disposed behind a chassis or heat generated from a circuit portion is prevented from damaging the plasma display panel.

Another aspect of the present invention provides a plasma display apparatus comprising: a plasma display panel, a chassis supporting the plasma display panel, and a sheet interposed between the plasma display panel and the chassis and comprising a thermally conductive layer contacting the plasma display panel and a noise reduction layer contacting the chassis.

In one embodiment, the noise reduction layer may function as a heat insulating layer.

In one embodiment, the noise reduction layer may have a plurality of pores. In another embodiment, the noise reduction layer may comprise a foam resin.

In one embodiment, the plasma display apparatus may further comprise at least one heat dissipation unit contacting the thermally conductive layer and disposed around the chassis. In one embodiment, the at least one heat dissipation unit may comprise at least one plate and at least one heat dissipation wing protruding from the plate and layered parallel to each other. In one embodiment, the at least one heat dissipation unit may be connected to the thermally conductive layer through a heat conduction portion.

In one embodiment, the plasma display panel may comprise: a front substrate and a rear substrate facing each other, barrier ribs interposed between the front substrate and the rear substrate and defining discharge cells in which a discharge occurs, discharge electrodes disposed on at least one location selected from a rear surface of the front substrate, inside of the barrier ribs, and a front surface of the rear substrate, fluorescent layers disposed in spaces defined by the barrier ribs and the rear substrate and a discharge gas in the discharge cells.

BRIEF DESCRIPTION OF THE DRAWINGS

Embodiments of the present invention will be described with reference to the attached drawings.

DETAILED DESCRIPTION OF CERTAIN INVENTIVE EMBODIMENTS

Hereinafter, a plasma display apparatus according to embodiments of the present invention will be described with reference to the attached drawings.

Figure 1:
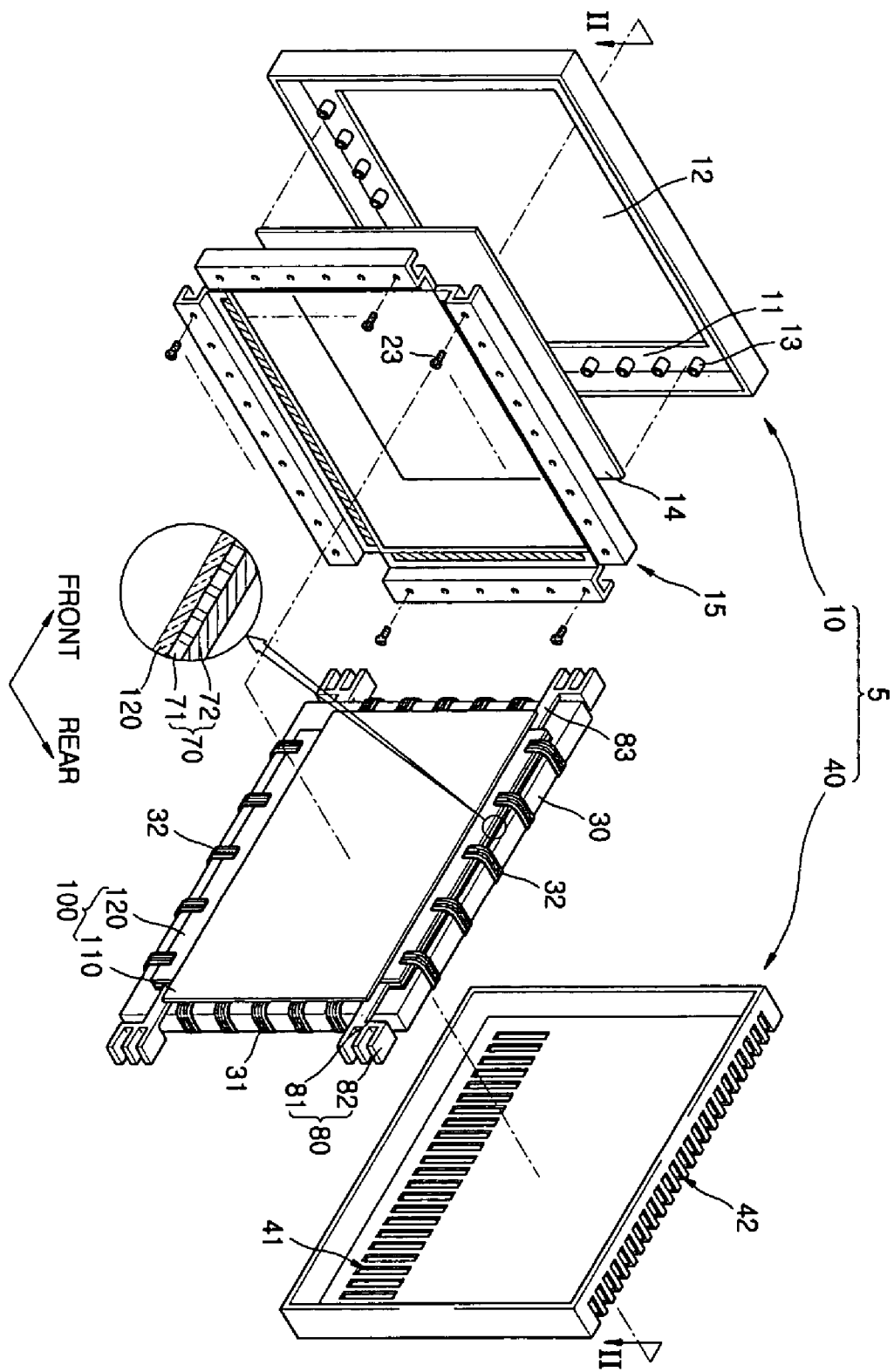
FIG. 1 is an exploded perspective view of a plasma display apparatus according to an embodiment of the present invention.
Figure 2:
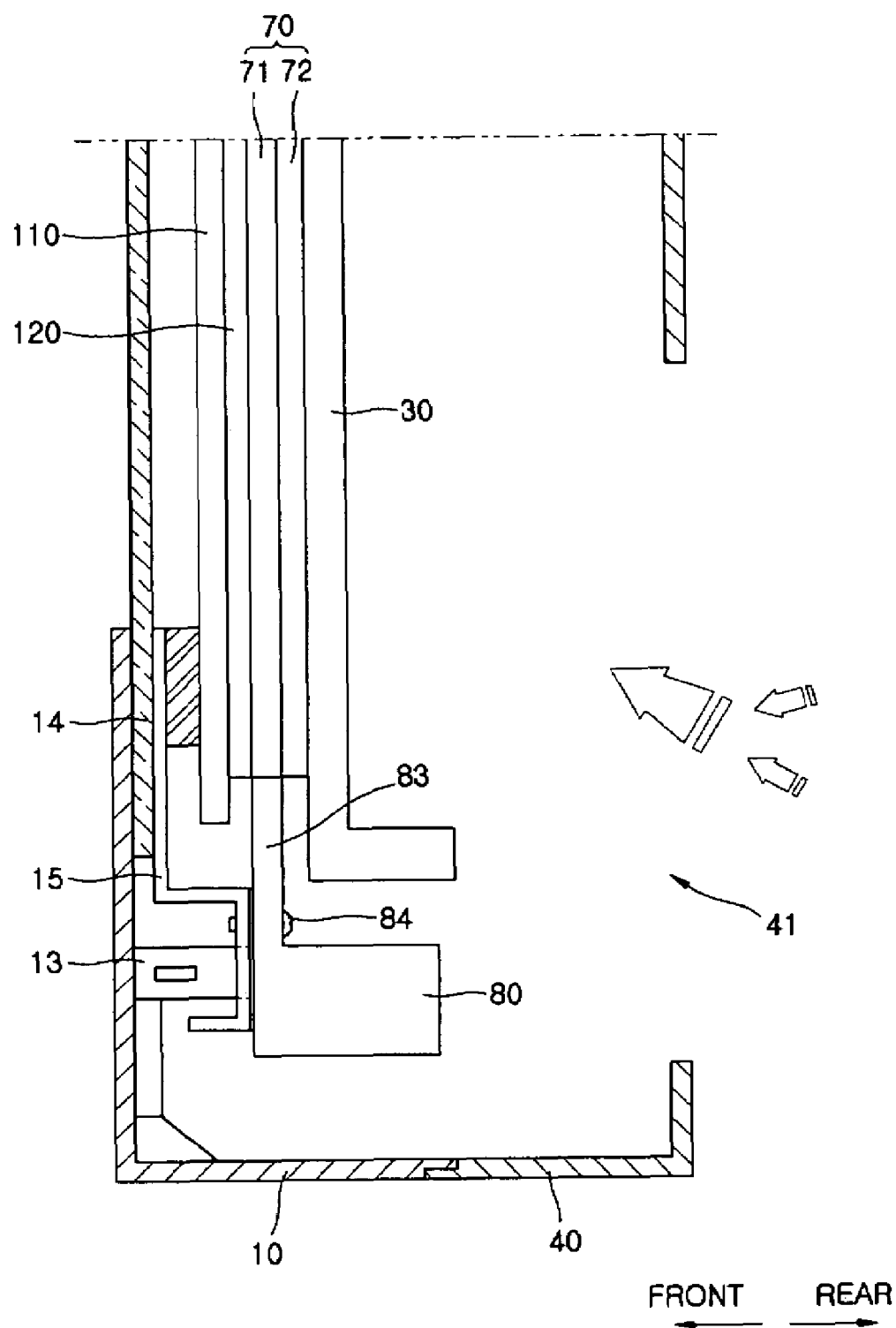
FIG. 2 is a cross-sectional view taken along line II-II of the plasma display apparatus illustrated in FIG. 1.

Referring to FIGS. 1 and 2, a plasma display apparatus according to an embodiment of the present invention comprises a front cabinet 10, in front of which a window 12 is disposed, an electromagnetic wave shielding filter 14 disposed behind the front cabinet 10 to cover the window 12 and shielding electromagnetic wave generated during driving a plasma display panel 100, a filter holder 15 fixing the electromagnetic wave shielding filter 14 to the front cabinet 10, and a plasma display panel 100 disposed behind the filter holder 15 and realizing images by generating visible light due to a discharge.

The plasma display apparatus comprises a chassis 30 supporting the plasma display panel 100 and formed of a material having a high thermal conductivity. The plasma display apparatus further comprises a sheet 70 interposed between the chassis 30 and the plasma display panel 100 and comprising a thermally conductive layer 71 and a noise reduction layer 72. In one embodiment, the thermally conductive layer 71 contacts a rear surface of the plasma display panel 100 and prevents heat generated during driving the plasma display panel 100 from being locally accumulated. In one embodiment, the noise reduction layer 72 contacts the chassis 30 and reduces noise by absorbing noise generated from a circuit portion (not shown) disposed on a rear surface of the chassis 30 and driving the plasma display panel 100 and noise generated during driving the plasma display panel 100.

In one embodiment, the plasma display apparatus may further comprise at least one heat dissipation unit 80 contacting the thermally conductive layer 71 and disposed around the chassis 30 such that heat transferred to the thermally conductive layer 71 from the plasma display panel 100 can be rapidly dispersed through the entire thermally conductive layer 71 to prevent the heat from being locally accumulated. Furthermore, heat accumulated in the thermally conductive layer 71 can be prevented from increasing and deteriorating the driving property of the plasma display panel 100.

In one embodiment, the heat dissipation unit 80 may comprise at least one plate 81 and at least one heat dissipation wing 82. In one embodiment, the heat dissipation unit 80 may be connected to the thermally conductive layer 71 of the sheet 70 through a heat conduction portion 83 having a high thermal conductivity.

In this embodiment, the heat conduction portion 83 contacts a sidewall of the thermally conductive layer 71 by pressing. Alternatively, the heat conduction portion 83 is interposed between the thermally conductive layer 71 and a heat insulating layer 72 which will be described later.

Referring to FIG. 2, the heat dissipation unit 80 may be fixed to the filter holder 15 by, for example, a coupling means 84. However, it is not necessary that the heat dissipation unit 80 is fixed to the filter holder 15. The heat dissipation unit 80 may be fixed to, for example, a cabinet 5.

In one embodiment, the noise reduction layer 72 may have pores such that the noise reduction layer 72 can effectively absorb the noise generated during driving the plasma display panel 100, thereby reducing the noise.

In another embodiment, the noise reduction layer 72 may comprise a foam resin such that the pores can be formed in the noise reduction layer 72. In one embodiment, the foam resin may include a chemical foam resin and a physical foam resin. In one embodiment, the chemical foam resin may include polystyrene, polypropylene, etc., and the physical foam resin may CFC, hydrogen, etc.

In one embodiment, in addition to the function of noise reduction, the noise reduction layer 72 may have a function of heat insulation in order to prevent the heat generated from the circuit portion disposed behind the chassis 30 from being transferred to the plasma display panel 100 and thus having an adverse effect on the images of the plasma display panel 100. Furthermore, the heat insulation function includes preventing the heat generated in the plasma display panel 100 from being transferred to the chassis 30 and then, the circuit portion disposed behind the chassis 30 and thus deteriorating the properties of circuit elements. Thus, the noise reduction layer 72 may function as a heat insulating layer.

When pores are formed in the noise reduction layer 72, the noise reduction layer 72 can have the function of heat insulation since thermal conductivity of the pores is very low. In one embodiment, the noise reduction layer 72 may further comprise polyurethane or ceramic fiber such that the noise reduction layer 72 can more efficiently function as the heat insulating layer.

In one embodiment, although the material of the noise reduction layer 72 is replaced by sponge, glass fiber, or etc., the noise reduction layer 72 can have both the functions of noise reduction and heat insulation. The positions and functions of the thermally conductive layer 71, the noise reduction layer 72, and the heat dissipation unit 80 will be described in more detail later.

The plasma display apparatus comprises connection cables 32 electrically connecting the circuit portion to a rear panel 120 of the plasma display panel 100, and a rear cabinet 40 disposed behind the circuit portion and combined with the front cabinet 10. Air outlets 42 for dissipating heat are formed in the upper portion of the rear cabinet 40 and air inlets 41 for allowing the external air to flow in for heat dissipation are formed in the lower portion of the rear cabinet 40. Although the cabinet 5 includes the front cabinet 10 and the rear cabinet 40 in the present embodiment, the cabinet 5 is not limited thereto.

Hereinafter, a plasma display panel 100 used in a plasma display apparatus according to an embodiment of the present invention will be described with reference to FIG. 3.

Figure 3:
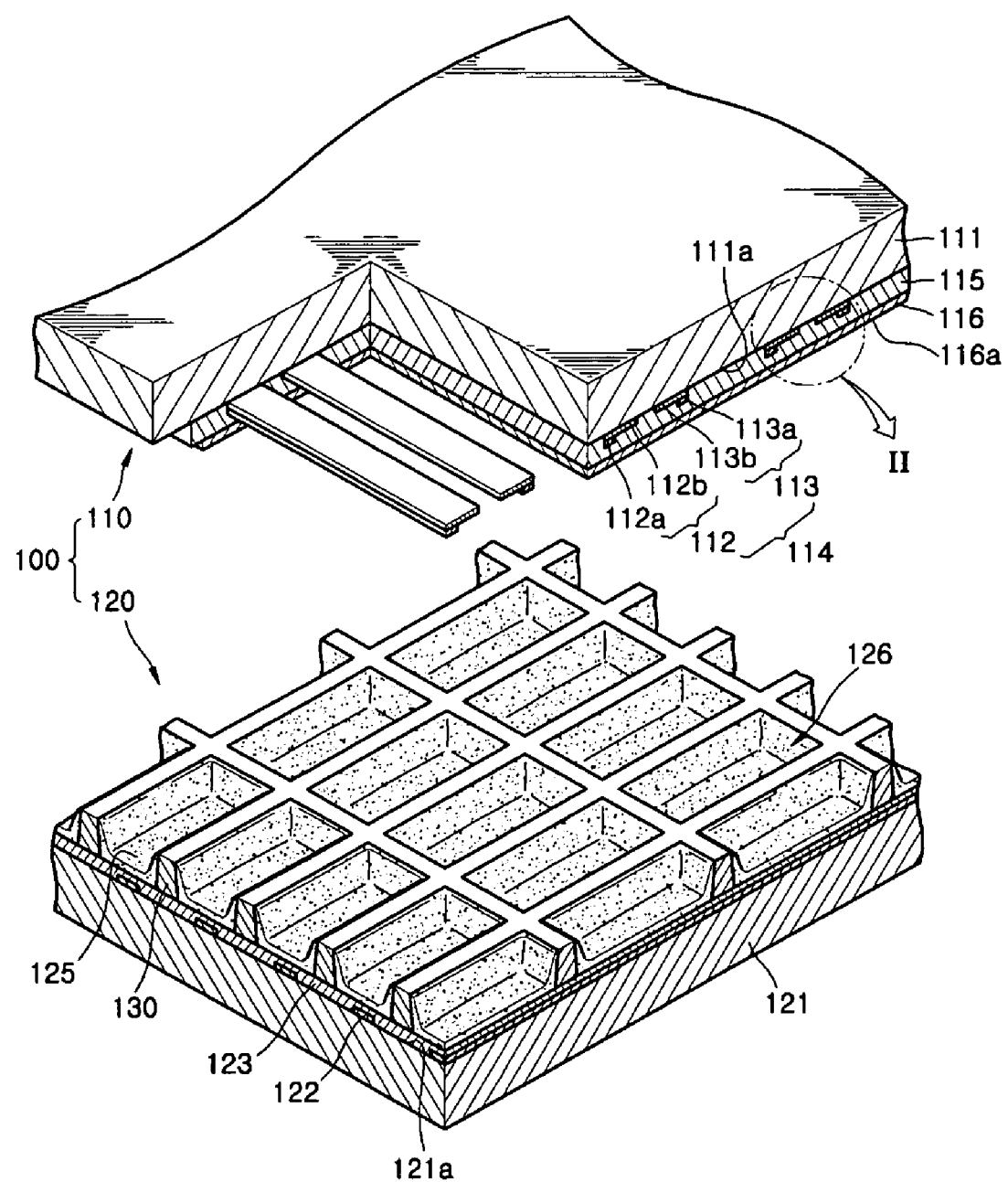
FIG. 3 is an exploded perspective view of a plasma display panel according to an embodiment of the present invention.

FIG. 3 is an exploded perspective view of a plasma display panel according to an embodiment of the present invention;

The plasma display panel 100 comprises a front panel 110 and a rear panel 120. The front panel 110 comprises a front substrate 111, pairs of sustain electrodes 114 including Y electrodes 112 and X electrodes 113 behind the front substrate 111, more specifically on a rear surface 111a of the front substrate 111, a front dielectric layer 115 covering the sustain electrodes 114, and a protective layer 116 covering the front dielectric layer 115. The sustain electrodes 114 composes a portion of discharge electrodes.

The front dielectric layer 115 induces charged particles due to a voltage applied between the sustain electrodes 114, thereby inducing wall charges for discharge. The protective layer 116 increases emission of secondary electrons, thereby allowing the discharge to be easily generated, and protects the front dielectric layer 115 and the sustain electrodes 114, thereby increasing lifetime of the plasma display panel 100.

In one embodiment, the Y electrodes 112 and X electrodes 113 comprise transparent electrodes 112b and 113b made of indium tin oxide (ITO) or the like, respectively, in order to transmit visible light. Since the transparent electrodes 112b and 113b are generally highly resistive, the Y electrodes 112 and X electrodes 113 further comprise bus electrodes 112a and 113a made of, for example, a highly conductive metal, respectively. In general, a predetermined voltage is applied by the bus electrodes 112a and 113a and the discharge occurs between the transparent electrodes 112b and 113b.

The bus electrodes 112a and 113a are connected to connection cables 31 disposed at right and left sides of the plasma display panel 100.

The rear panel 120 comprises a rear substrate 121, address electrodes 122 composing a portion of the discharge electrodes, disposed in front of the rear substrate 121, more specifically on a front surface 121a of the rear substrate 121 and intersecting the pairs of sustain electrodes 114, and a rear dielectric layer 123 covering the address electrodes 122.

The address electrodes 122 generate an address discharge which selects one of discharge cells 126 on which an image to be displayed during driving the plasma display panel 100. The rear dielectric layer 123 induces charged particles, thereby generating wall charges, when a predetermined voltage is applied to the address electrodes 122. Thus, after the address discharge occurs, the rear dielectric layer 123 aids the selection of the discharge cells 126, but the rear dielectric layer 123 is not an essential element in the plasma display panel 100.

The rear panel 120 comprises barrier ribs 130 defining the discharge cells 126, which are spaces in which the discharge occurs, together with the front substrate 111 and the rear substrate 121. The barrier ribs 130 prevent cross-talk between the discharge cells 126, resist a pressure between the front panel 210 and the rear panel 220 which is caused by the vacuum (for example, 0.5 atm) of the discharge gas filled in the discharge cells 126. In one embodiment, the discharge gas may include neon (Ne), helium (He), or argon (Ar), each containing about 10% of xenon (Xe) gas.

Fluorescent layers 125 are disposed in spaces defined by the barrier ribs 130 and the rear substrate 121. For the plasma display panel 100 to realize color images, red, green, and blue light-emitting fluorescent layers may be disposed in the discharge cells 126 to form unit pixels. The fluorescent layers 125 are generally formed by coating a fluorescent paste comprising either red, green, or blue light-emitting fluorescent material, a solvent, and a binder, on a front surface of the rear dielectric layer 123 and sidewalls of the barrier ribs 130 in the discharge cells 126, and drying and baking the resultant structure.

In one embodiment, the red light-emitting fluorescent material may be $(Y,Gd)BO_3:Eu^{3+}$, etc., the green light-emitting fluorescent material may be $Zn_2SiO_4:Mn^{2+}$, etc. and the blue light-emitting fluorescent material may be $BaMgAl_{10}O_{17}:Eu^{2+}$, etc. The address electrodes 122 are connected to connection cables 32 disposed at upper and lower sides of the plasma display panel 100.

Figure 4:
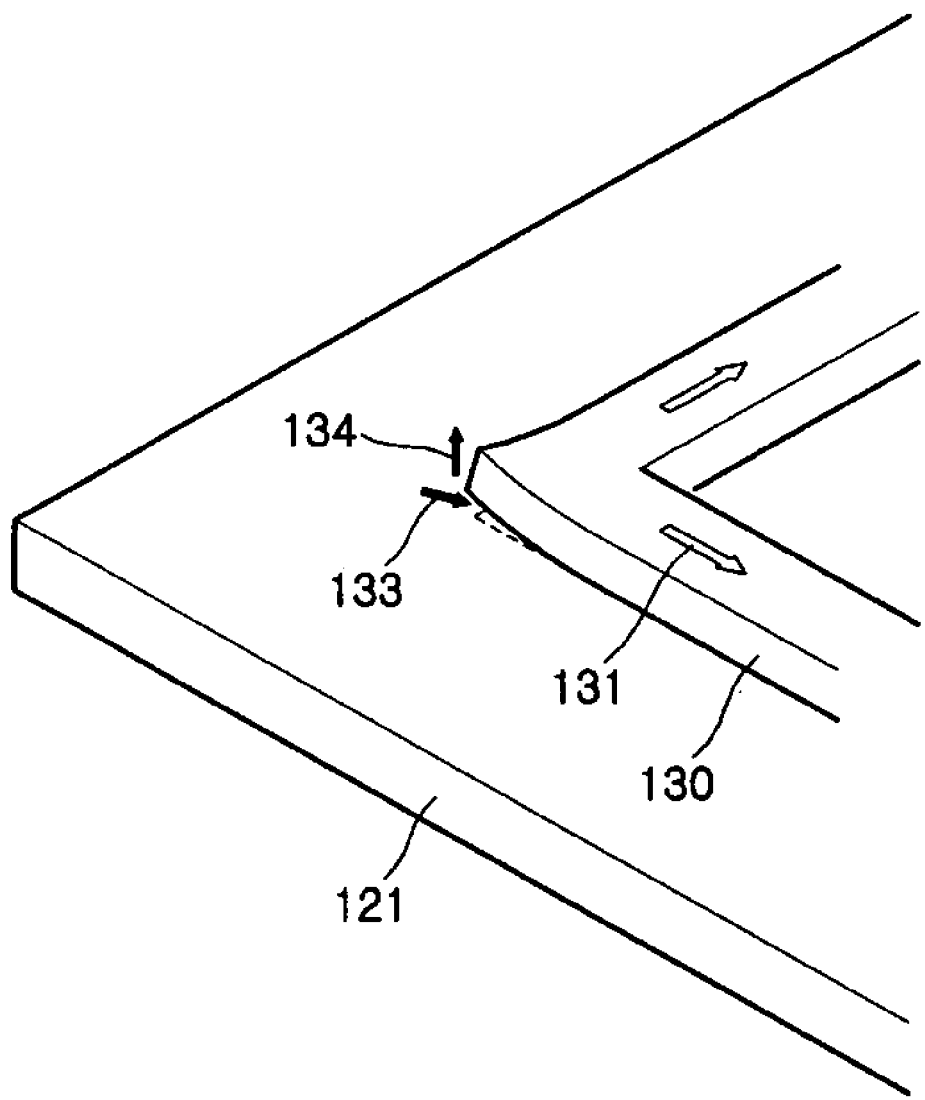
FIG. 4 is a perspective view illustrating rising and separation due to shrinkage generated during the manufacturing of barrier ribs composing a plasma display panel according to an embodiment of the present invention.

Referring to FIGS. 3 and 4, the reason why noise is generated in the plasma display panel 100, the reason why heat is generated in the plasma display panel 100, and means for reducing the noise and the heat will now be explained by way of examples. Further, noise and heat generated from circuit elements of a circuit portion driving the plasma display panel 100 and means for reducing the noise and the heat will now be explained by way of examples.

Generally, the barrier ribs 130 of the plasma display panel 100 are formed by coating a paste comprising a barrier rib material on a specific layer in front of the rear substrate 121. More specifically, on a front surface of the rear dielectric layer 123, the barrier ribs 130 are formed by patterning the coating using a sandblasting process or etc., and baking the resultant product to remove volatile substances and to provide a strength to the resultant product.

In the baking process, the rear panel 120 is placed into a baking furnace having a maximum temperature (about 550° C.) which is slightly higher than a softening temperature of the barrier rib material. During the baking, the volatile substances, etc., contained in the barrier rib material are removed and thus, the barrier rib material shrinks at a predetermined shrinkage rate.

Referring to FIG. 4, when a barrier rib 130 shrinks due to shrinkage of a barrier rib material, a length of the barrier rib 130 is shortened in shrinkage directions 131 extending toward the center of the plasma display panel 100, thus generating a compressive stress due to the shrinkage.

At this time, the compressive stress applied to the barrier rib 130 increases as the barrier rib 130 is more distant from the center of the plasma display panel 100. As a result, a high stress is applied to barrier ribs 130 disposed in outer portion of the plasma display panel 100 and especially, the maximum stress is applied to barrier ribs 130 disposed at the outermost portion. Due to the stress, a rotation moment is generated and thus, rising 134 and separation 133 occur at the barrier rib 130 disposed in the outer portion of the plasma display panel 100.

Then, if the rising occurs at the barrier ribs 130, when the front panel 110 and the rear panel 120 are combined to form the plasma display panel 100, the front panel 110 cannot fit the rear panel 120 at the outer portion of the plasma display panel 100 due to the rising barrier ribs 130. Thus, a gap forms between the barrier ribs 130 and the front panel 110 along an edge of the plasma display panel 100. As a result, the plasma display panel 100 vibrates by shock waves generated by the discharge in discharge cells 126 during driving the plasma display panel 100 and the front panel 110 periodically impacts with the barrier ribs 130 between the gap, generating the noise.

Further, when the shock waves strike the barrier ribs 130 due to the separation generated in the rear panel 120, the barrier ribs 130 violently vibrate and thus, the barrier ribs 130 periodically strike the rear panel 120, thereby generating serious noise.

In this way, since the noise generated from the plasma display panel 100 is caused by the vibration between the front panel 110 and the barrier ribs 130 or between the rear panel 120 and the barrier ribs 130, the noise generated from the plasma display panel 100 can be reduced by reducing the vibration.

At this time, since the vibration is transferred to the entire plasma display panel 100, the noise due to the vibration can be reduced by absorbing the vibration transferred to the plasma display panel 100 or absorbing sound waves generated due to the vibration of the plasma display panel 100.

Based on such a concept, in one embodiment, a predetermined layer comprising a noise reduction layer 72 may be disposed behind the plasma display panel 100 for the noise reduction layer 72 to absorb the vibration of the plasma display panel 100 or the sound waves generated due to the vibration.

However, in one embodiment, since the noise reduction layer 72 has generally a low heat dissipating performance, it is undesirable that the noise reduction layer 72 is directly attached to a rear surface of the plasma display panel 100. As described above, a thermally conductive layer 71 of a sheet 70 contacts a rear surface of the plasma display panel 100 and the noise reduction layer 72 contacts the thermally conductive layer 71, and thus, the noise generated from the plasma display panel 100 can be reduced.

As described above, the plasma display panel 100 is driven by the circuit portion disposed on the rear surface of the chassis 30. The driving of the plasma display panel 100 is performed in such a way that an image signal received from the exterior is converted to an electric signal and an electric potential corresponding to the image signal is applied between the discharge electrodes.

Since the circuit portion processes a large amount of data rapidly, a violent vibration occurs by its switching. When the vibration is transferred to the chassis 30 without being reduced, the chassis 30 vibrates and thus, sound waves are generated, thereby generating noise. When the noise exceeds a predetermined level, the plasma display panel 100 has a low value of commodities. Thus, there is a need for a means for reducing the noise generated from the circuit portion.

A large proportion of the noise generated from the circuit portion is transferred through the chassis 30 in the form of vibration to diffuse into the air, which is recognized as a noise. Thus, there is a need reduce the vibration transferred through the chassis 30. The noise reduction layer 72 attached to the chassis 30 absorbs the vibration of the chassis 30, thereby reducing the noise.

The plasma display panel 100 realizes the image corresponding to the image signal received from the exterior. A discharge is selectively generated in a plurality of discharge cells 126 corresponding to the external image signal and a fluorescent layer 125 disposed in the discharge cell 126 in which the discharge occurs is excited and visible light is emitted from the fluorescent layer 125 to realize the image.

The term "discharge" refers to a process in which charged particles in the discharge cells 126 collide with a discharge gas due to an electric potential applied between discharge electrodes and then, the discharge gas is excited, thus emitting ultraviolet (UV) light. A considerable amount of energy is converted to heat energy while the charged particles collide with the discharge gas during the discharge and only a small portion of the energy excites the particles of the discharge gas. Since heat is generated in the discharge cells 126 in which the discharge occurs and, as described above, the discharge in the discharge cells 126 is selectively generated corresponding to the external image signal, a probability that heat is locally generated from the discharge cells 126 is high.

When the heat is locally accumulated in some discharge cells 126 due to continuous occurrences of the discharge, the functions of the fluorescent layers 125 in the discharge cells 126 are deteriorated by the heat, thus generating after-images, etc., on images realized by the plasma display panel 100. Thus, image quality of the plasma display panel 100 deteriorates. Further, the fluorescent layers 125 are damaged by the heat, thereby shortening lifetime of the plasma display panel 100.

The above problems caused by the local accumulation of heat can be overcome by contacting the thermally conductive layer 71 to the rear surface of the plasma display panel 100 to uniformly distribute the heat over the entire plasma display panel 100.

Although the local accumulation of heat can be prevented by uniformly distributing the heat generated from the plasma display panel 100 over the entire plasma display panel 100, the heat generated from the plasma display panel 100 can exceed an acceptable limit.

In one embodiment, in order to overcome this problem, the plasma display apparatus may further comprise at least one heat dissipation unit 80 contacting the thermally conductive layer 71 of the sheet 70 and disposed around the chassis 30.

In one embodiment, the heat dissipation unit 80 may be fixed to a filter holder 15 by, for example, a coupling means 84. The heat dissipation unit 80 contacts a heat conduction portion 83 and the heat conduction portion 83 may press the thermally conductive layer 71 such that the heat transferred to the thermally conductive layer 71 is conducted to the heat dissipation unit 80 and dissipated.

In one embodiment, the heat dissipation unit 80 may comprise at least one plate 81 and at least one heat dissipation wing 82 protruding from the plate 81 and layered parallel to each other, in order to increase its surface area contacting the external air which is flowed in through the air inlets 41 and flowed out through the air outlets 42.

The circuit elements composing the circuit portion which drives the plasma display panel 100 generate a large amount of heat due to the switching operations. Since these circuit elements are composed of a semiconductive material and thus, weak to heat, the heat must be dissipated in a good manner. Thus, in one embodiment, the chassis 30 is formed of a highly conductive material, for example, aluminium, and the heat generated from the circuit elements is conducted through the chassis 30 and dissipated to the exterior.

However, when the heat generated from the circuit elements is conducted to the plasma display panel 100 through the chassis 30, heat dissipation performance of the plasma display panel 100 decreases and the problems induced by the heat in the plasma display panel 100 as described above can occur.

Similarly, the plasma display panel 100 generates a large amount of heat and when the heat is conducted to the chassis 30 and then, to the circuit elements of the circuit portion, the properties of the circuit elements are damaged and the plasma display panel 100 cannot easily realize desired images.

In one embodiment, in order to overcome these problems, the plasma display panel 100 is insulated from the chassis 30. The chassis 30 generally physically supports the plasma display panel 100, thereby preventing the plasma display panel 100 from being deformed by, for example, heat, or from being damaged by external impacts.

Thus, the chassis 30 should contact directly the rear surface of the plasma display panel 100 such that the chassis 30 supports the plasma display panel 100. However, since the direct contact between the chassis 30 and the plasma display panel 100 can occur the problems described above, the noise reduction layer 72 composing the sheet 70 contacting the chassis 30 functions as a heat insulating layer and contacts the rear surface of the chassis 30.

Since the chassis 30 is formed of a highly conductive material and many heat dissipating units are attached to the chassis 30, the heat conducted from the circuit portion can be conducted to the chassis 30 and heat dissipation can be effected in a good manner. Thus, the heat conductive property of the chassis 30 is not deteriorated due to the contact with the heat insulating layer 71.

Figure 5:
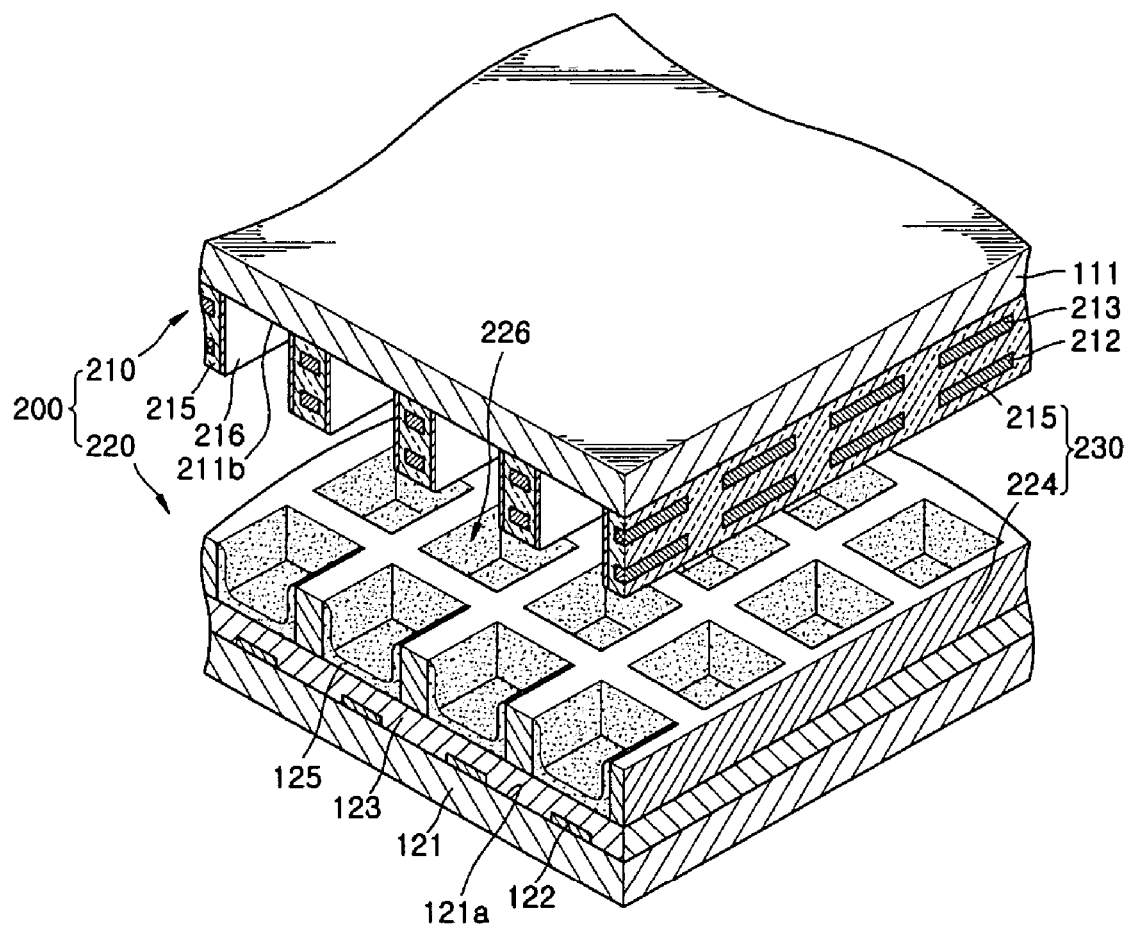
FIG. 5 is an exploded perspective view of a plasma display apparatus according to another embodiment of the present invention.

Referring to FIG. 5, a plasma display panel 200 used in a plasma display apparatus according to another embodiment of the present invention will be explained based on the points which differ from the PDP 100 illustrated in FIG. 3. The plasma display panel 200 has a structure in which front discharge electrodes 213 and rear discharge electrodes 212 are disposed in front barrier ribs 215, which are portions of barrier ribs 230, so as to surround discharge cells 226, unlike a conventional alternating current, triode-type, surface discharge plasma display panel in which pairs of sustain electrodes, which are portions of discharge electrodes, are disposed on a rear surface of a front substrate.

In one embodiment, at least portions of the barrier ribs 230 are formed of a dielectric material. In another embodiment, inner surfaces of portions of the barrier ribs 230 which are surrounded by the front discharge electrodes 213 and the rear discharge electrodes 212 are coated with the dielectric material. In one embodiment, according to a manufacturing process, the entire barrier ribs 230 may be formed of the dielectric material.

For an address discharge for selecting the discharge cells 226, address electrodes 122 extend so as to cross the front discharge electrodes 213 and rear discharge electrodes 212. As in the plasma display panel 100 illustrated in FIG. 3, the address electrodes 122 are covered with a rear dielectric layer 123 and fluorescent layers 125 are disposed in spaces defined by rear barrier ribs 224, which are portions of the barrier ribs 230, and a rear substrate 121.

As in the plasma display panel 100 illustrated in FIG. 3, the discharge cells 226 are filled with a discharge gas, such as neon (Ne), helium (He), argon (Ar), each containing about 10% of xenon (Xe) gas, or their mixture.

Since a plasma display apparatus according to an embodiment of the present invention has characteristics in that it has an improved heat dissipating performance and a reduced noise level, the scope of the present invention is not limited by modified examples of the above plasma display panels.

In a plasma display apparatus according to one embodiment of the present invention, heat generated from a plasma display panel is transferred through a thermally conductive layer, and thus, the heat is prevented from being locally concentrated on the plasma display panel and the heat transferred to the thermally conductive layer is transferred to a heat dissipation unit, thereby increasing heat dissipation performance.

Further, the plasma display apparatus according to one embodiment of the present invention comprises a heat insulating layer contacting a chassis, and thus, heat generated from a circuit portion attached to a chassis is not conducted to the plasma display panel and the heat generated from the plasma display panel is not conducted to the circuit portion. Thus, the operational performance of the plasma display panel and the circuit portion is prevented from being damaged due to the conducted heat.

Since pores are formed in the heat insulating layer contacting the chassis in the plasma display apparatus according to one embodiment of the present invention, vibration and noise generated due to shock waves, etc., during driving the plasma display panel are reduced, thereby providing a high quality plasma display apparatus.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A plasma display apparatus, comprising:
a plasma display panel;
a chassis supporting the plasma display panel;
a sheet, interposed between the plasma display panel and the chassis, comprising a thermally conductive layer contacting the plasma display panel and a noise reduction layer contacting the chassis;
a heat conduction portion extending from the thermally conductive layer; and
at least one heat dissipation unit extending from the heat conduction portion in the same direction of extension as the heat conduction portion.

2. The plasma display apparatus of claim 1, wherein the noise reduction layer functions as a heat insulating layer.

3. The plasma display apparatus of claim 1, wherein the noise reduction layer has a plurality of pores.

4. The plasma display apparatus of claim 3, wherein the noise reduction layer comprises a foam resin.

5. The plasma display apparatus of claim 1, wherein the at least one heat dissipation unit does not contact the chassis.

6. The plasma display apparatus of claim 5, wherein the at least one heat dissipation unit comprises at least one plate and at least one heat dissipation wing protruding from the plate and layered parallel to each other.

7. The plasma display apparatus of claim 1, wherein the extension direction is substantially perpendicular to a line connecting the noise reduction layer and the chassis.

8. The plasma display apparatus of claim 1, wherein the plasma display panel comprising:
a front substrate and a rear substrate facing each other;
a plurality of barrier ribs interposed between the front substrate and the rear substrate and defining discharge cells in which a discharge occurs;
a plurality of discharge electrodes disposed on at least one location selected from a rear surface of the front substrate, inside of the barrier ribs, and a front surface of the rear substrate;
at least one fluorescent layer disposed in each of discharge cells defined by the barrier ribs and the rear substrate; and
a discharge gas provided in the discharge cells.

9. The plasma display apparatus of claim 1, wherein the sheet includes i) a first sheet including the noise reduction layer and ii) a second sheet including the thermally conductive layer.

10. A plasma display apparatus, comprising:
a plasma display panel;
a chassis supporting the plasma display panel;
a noise reduction layer interposed between the plasma display panel and the chassis;
a thermally conductive layer interposed between the plasma display panel and the noise reduction layer; and
at least one heat dissipation section contacting and extending away from the thermally conductive layer.

11. The plasma display apparatus of claim 10, wherein the noise reduction layer is configured to contact the chassis.

12. The plasma display apparatus of claim 10, wherein the at least one heat dissipation section does not contact the chassis.

13. The plasma display apparatus of claim 10, wherein the extension direction of the at least one heat dissipation section is substantially perpendicular to a line connecting the noise reduction layer and the chassis.

14. The plasma display apparatus of claim 10, wherein the noise reduction layer has a plurality of pores.

15. The plasma display apparatus of claim 10, wherein the noise reduction layer comprises a foam resin.

16. A structure for a flat panel display apparatus, the structure comprising:
a noise reduction layer configured to be interposed between a flat display panel and a chassis, and configured to reduce at least one of noise and vibration generated during the operation of the display apparatus;
a thermally conductive layer interposed between the plasma display panel and the noise reduction layer; and
at least one heat dissipation section contacting and extending away from the thermally conductive layer.

17. The structure of claim 16, wherein the noise reduction layer is configured to reduce the noise generated by at least one of i) shock waves due to a discharge and ii) vibration due to the operation of a drive circuitry of the display apparatus.

18. The structure of claim 16, wherein the at least one heat dissipation section does not contact the chassis.

19. The structure of claim 16, wherein the noise reduction layer has a plurality of pores.

20. The structure of claim 16, wherein the noise reduction layer comprises a foam resin.

* * * * *